(12) United States Patent
Caris et al.

(10) Patent No.: US 9,853,084 B2
(45) Date of Patent: Dec. 26, 2017

(54) METHOD OF MANUFACTURING A SEMICONDUCTOR DEVICE

(71) Applicant: DPIX, LLC, Colorado Springs, CO (US)

(72) Inventors: Frank Caris, Colorado Springs, CO (US); Shawn Michael O'Rourke, Colorado Springs, CO (US); Byung-Kyu Park, Colorado Springs, CO (US); Brian Rees, Colorado Springs, CO (US)

(73) Assignee: DPIX, LLC, Colorado Springs, CO (US)

( * ) Notice: Subject to any disclaimer, the term of this patent is extended or adjusted under 35 U.S.C. 154(b) by 0 days.

(21) Appl. No.: 15/275,057

(22) Filed: Sep. 23, 2016

(65) Prior Publication Data

US 2017/0084665 A1    Mar. 23, 2017

Related U.S. Application Data

(60) Provisional application No. 62/284,209, filed on Sep. 23, 2015.

(51) Int. Cl.
*H01L 27/146* (2006.01)

(52) U.S. Cl.
CPC .... *H01L 27/14689* (2013.01); *H01L 27/1462* (2013.01); *H01L 27/14612* (2013.01); *H01L 27/14643* (2013.01); *H01L 27/14685* (2013.01); *H01L 27/14692* (2013.01); *H01L 27/14698* (2013.01); *H01L 27/14609* (2013.01); *H01L 27/14636* (2013.01)

(58) Field of Classification Search
CPC ......... H01L 27/14689; H01L 27/14692; H01L 27/14612; H01L 27/14643; H01L 27/14685; H01L 27/14698; H01L 27/1462; H01L 27/14609; H01L 27/14636
USPC .......................................................... 438/59
See application file for complete search history.

(56) References Cited

U.S. PATENT DOCUMENTS

| | | | | |
|---|---|---|---|---|
| 2006/0067650 | A1* | 3/2006 | Chui | G02B 26/001 385/147 |
| 2009/0026509 | A1* | 1/2009 | Hayashi | H01L 27/14603 257/292 |

* cited by examiner

*Primary Examiner* — Caleen Sullivan
(74) *Attorney, Agent, or Firm* — Slater Matsil, LLP

(57) ABSTRACT

A method of manufacturing an image sensor device includes, in a first manufacturing facility, forming a first set of patterned silicon, metal, and insulating layers on a glass substrate, forming an electrical and mechanical protection layer over the first set of patterned silicon, metal, and insulating layers, and, in a second manufacturing facility, removing the electrical and mechanical protection layer, forming a second set of patterned silicon, metal, and insulating layers over the first set of patterned silicon, metal, and insulating layers, forming a plurality of photosensors in communication with at least the second set of patterned silicon, metal, and insulating layers to form an unpassivated image sensor device, and forming a passivation layer over the unpassivated image sensor device. The materials used in the first set of layers and second set of layers can be completely or partially different.

21 Claims, 16 Drawing Sheets

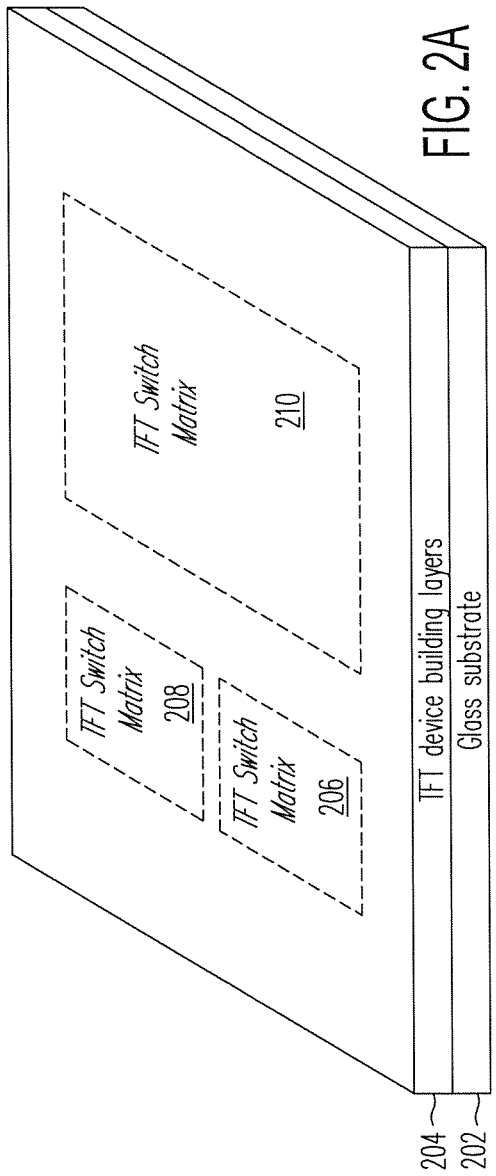
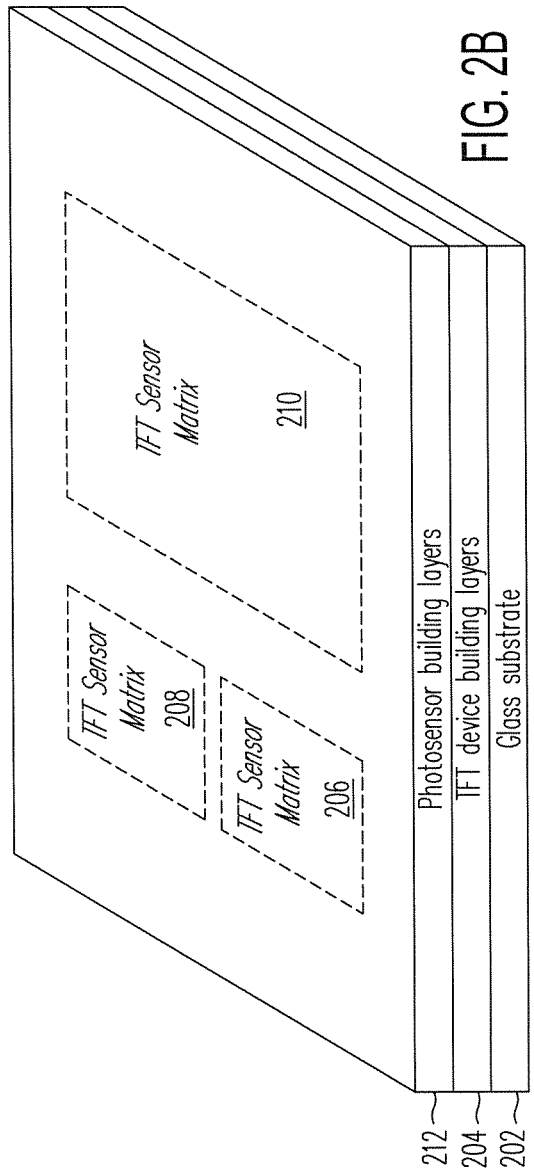

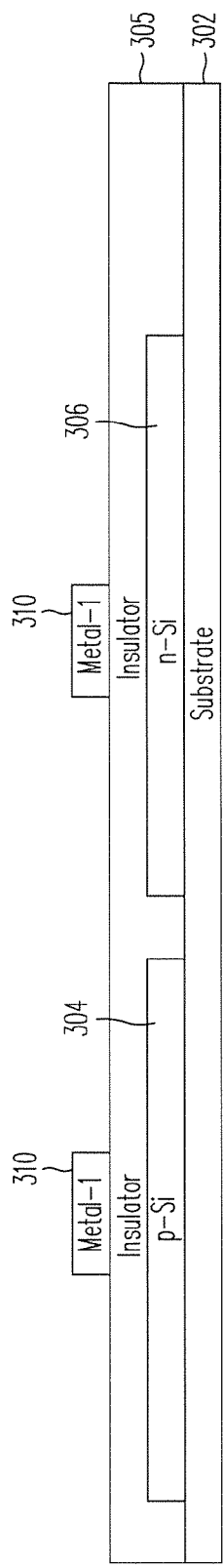
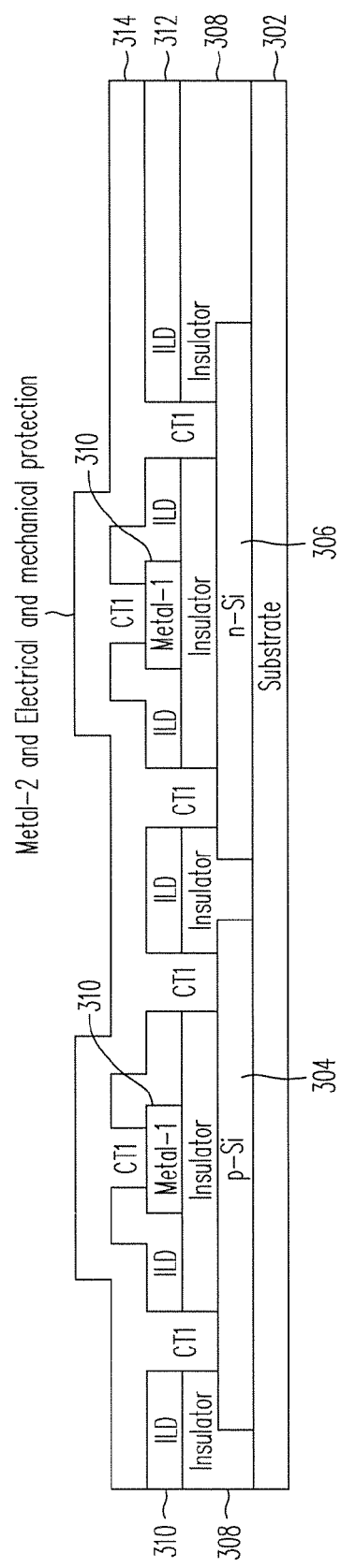
FIG. 3A
FIG. 3B

METHOD OF MANUFACTURING A SEMICONDUCTOR DEVICE

RELATED APPLICATIONS

The present application relates to and claims priority of U.S. provisional patent application ("Provisional Application"), Ser. No. 62/284,209, filed on Sep. 23, 2015. The disclosure of the Provisional Application is hereby incorporated by reference in its entirety.

BACKGROUND OF THE INVENTION

1. Field of the Invention

The present invention generally relates to image sensor devices, and, more particularly, to a method for manufacturing the image sensor devices.

2. Relevant Background

Image sensor devices are known in the art and are typically manufactured at a single manufacturing facility. A subset of image sensor devices includes a glass substrate and can be used, for example, as a flat panel imager for use in X-ray imaging (digital radiography). This type of image sensor device is also typically manufactured at a single manufacturing facility, using semiconductor processing steps. Currently available manufacturing processes typically dedicate a new production batch to a single semiconductor material type. This restriction on the manufacturing process inherently limits the versatility and scalability of the image sensor product being produced. It would therefore be desirable to provide a manufacturing method for an image sensor device that can overcome the above restrictions and limitations.

SUMMARY OF THE INVENTION

Currently available large area state-of-the-art flat panel imagers for digital radiography rely on amorphous silicon (a-Si:H) or Indium Gallium Zinc Oxide thin film transistors coupled with a photoconductor or photodiode to generate an image sensor array. While these thin film transistor technologies offer some advantages in the manufacture of imaging arrays (i.e. large area uniformity), other aspects of performance such as NMOS only architecture necessitate the integration of complex and expensive packaged semiconductor driver and read-out chips in order to facilitate operation of the array. Furthermore, the integration of on-glass (substrate) circuits to reduce the total number of external driver or to introduce high performance data schemes is limited due to the intrinsic threshold bias instability (Vt shift) of amorphous Silicon as well as the low electron mobility.

Overshadowing the technical situation described above is an overall trend in flat panel imaging to reduce overall system cost and/or increase acquisition speed (i.e. increased frame rate.)

According to an embodiment of the present invention, a manufacturing method for a flat panel imager addresses both of the above issues through the integration of multiple semiconductor technologies achieved by the integration of one or more semiconductor elements on a substrate from a first manufacturing facility integrated with one or more imager elements finished on top of the partially completed imager at a second manufacturing facility.

According to an embodiment of the present invention, a method of manufacturing an image sensor device comprises, in a first manufacturing facility, forming a first set of patterned silicon, metal, and insulating layers on a glass substrate, forming an electrical and mechanical protection layer over the first set of patterned silicon, metal, and insulating layers, and, in a second manufacturing facility, removing the electrical and mechanical protection layer, forming a second set of patterned silicon, metal, and insulating layers over the first set of patterned silicon, metal, and insulating layers, forming a plurality of photosensors in communication with at least the second set of patterned silicon, metal, and insulating layers to form an unpassivated image sensor device, and forming a passivation layer over the unpassivated image sensor device.

It is important to note that the first set of patterned layers can use completely different materials that those used in the second set of patterned layers. In an extreme case, materials that are forbidden in the first manufacturing facility can be used in the second manufacturing facility. The functions and components associated with the image sensor device can be shared in any manner between the two manufacturing facilities. For example, certain components can be partially completed in the first manufacturing facility and then fully completed in the second manufacturing facility. Other components can be completely formed in the first manufacturing facility and then coupled to subsequently formed components using interconnect metal layers. The interconnect metal layers can be associated with the first set of patterned layers, the second set of patterned layers, or both.

It is also important to note that the partially formed image sensor device must be both mechanically and electrically protected so that it can be shipped to the second manufacturing facility without appreciable loss of product due to mechanical damage in transit or electrical damage due to overvoltage stress from static electricity. The partially formed image sensor is completely covered by a passivation or other type of layer that both adds mechanical support and prevents electrical damage. The passivation layer is removed at the second manufacturing facility and the manufacturing process resumes with the same or a different semiconductor process. Finally, the image sensor device is again passivated.

The image sensor device and method of manufacturing is fully described below with various embodiments and examples, and is illustrated in the following drawings.

BRIEF DESCRIPTION OF THE DRAWINGS

FIGS. 2A-2D illustrate, in plan views, the manufacturing method of FIGS. 1A-1D;

FIGS. 3A-3B illustrate, in cross-sectional views, a first set of manufacturing steps that takes place in a first manufacturing facility, according to the method of the present invention;

DETAILED DESCRIPTION OF THE PREFERRED EMBODIMENTS

A manufacturing process for an image sensor device performed in a single manufacturing facility is illustrated with respect to FIGS. 1A-1D.

Figure 1A:
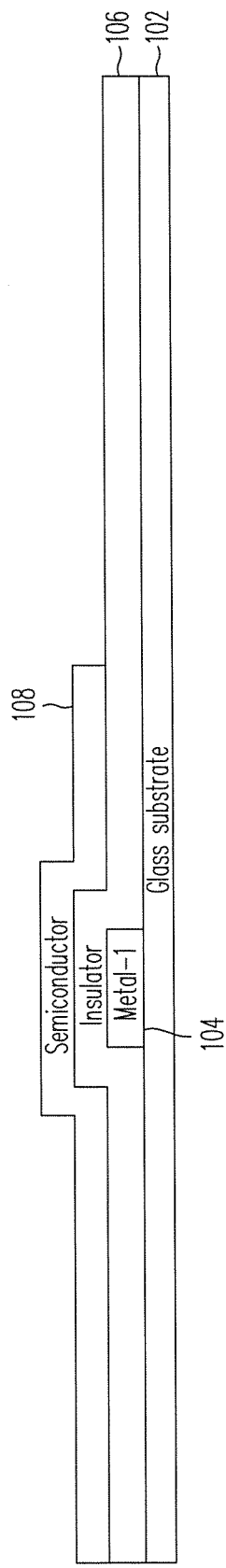
FIGS. 1A-1D illustrate, in cross-sectional views, a manufacturing method that takes place in a single manufacturing facility.

FIG. 1A illustrates the first process steps used to build TFT (Thin-Film Transistor) devices. These devices are field-effect transistors (FETs) that can be either a Metal-Insulator-Semiconductor (MIS) or Metal-Oxide-Semiconductor (MOS) structure. FIG. 1A illustrates a bottom-gate TFT process flow, but a top-gate process flow can be used as well. FIG. 1A illustrates a glass substrate 102, a first metal layer 104 that has been etched to form a gate, an insulator layer 106, and a semiconductor layer 108.

Figure 1B:
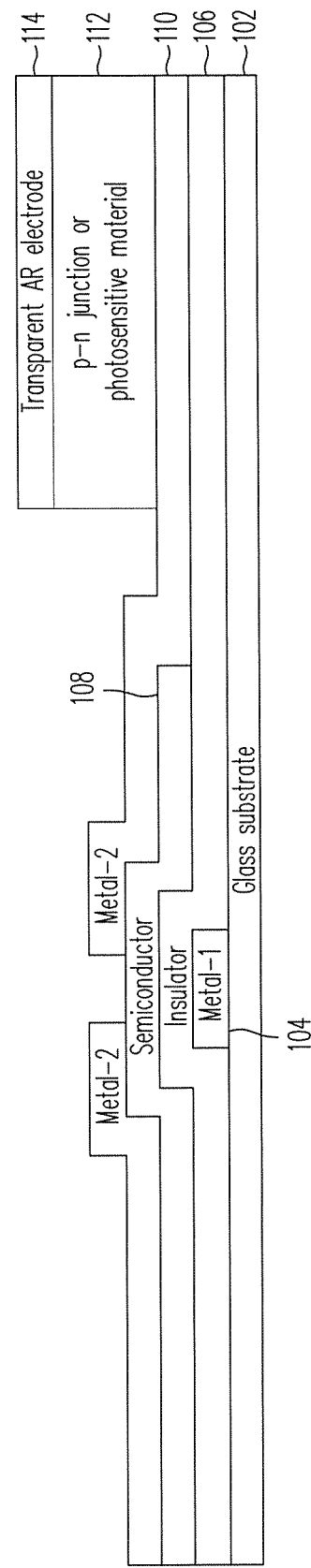

FIG. 1B illustrates the second process steps that are used to build photo-sensitive devices. These devices could be photodiodes formed with p-n junctions or photosensitive compounds. The electrode facing incident photons is made of a transparent and/or anti-reflective (AR) material. In addition to the previously described layers, FIG. 1B illustrates an etched second metal layer 110, photosensitive material 112, and the transparent and/or AR electrode 114.

Figure 1C:
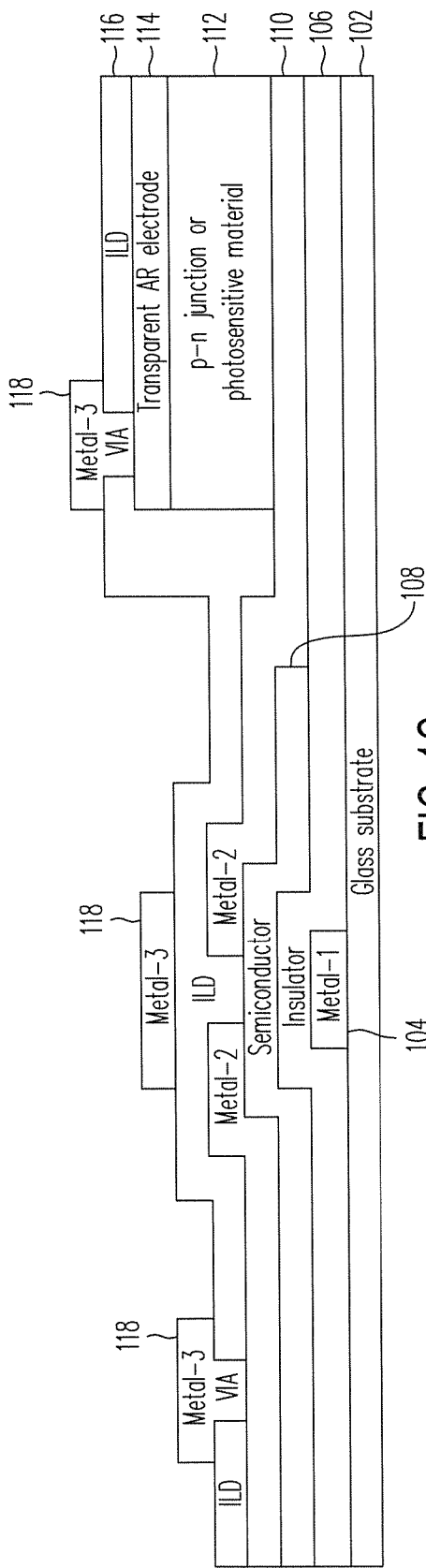

FIG. 1C illustrates the third process steps that are used to build metal interconnect layers. The interconnect layers include multiple insulator and metal layers. To interconnect the metal layers, vias or contact holes are made through the inter-layer dielectric (ILD) films. In addition to the previously described layers, FIG. 1C illustrates an etched ILD layer 116, a third etched metal layer 118, and a plurality of vias and contact holes.

Figure 1D:
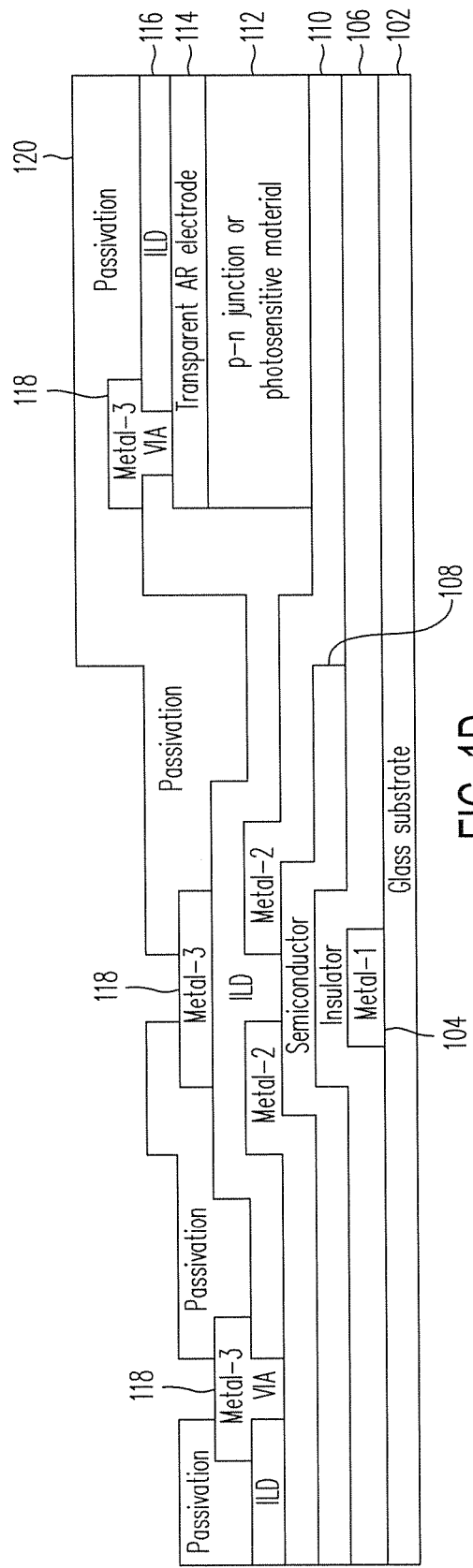

FIG. 1D illustrates the final process steps associated with the application of a passivation layer. The passivation layer provides the protection to the integrated devices against moisture and mechanical/chemical corrosion or damage. Passivation windows are opened for bonding access. In addition to the previously described layers, FIG. 1D illustrates an etched passivation layer 120 including access via passivation windows to the third metal layer 118.

FIG. 2A illustrates the first process steps used to build the TFT devices. These TFT devices form two-dimensional switch matrices on the flat panel image sensor device. FIG. 2A thus illustrates a glass substrate 202, the TFT device building layers 204, and TFT switch matrices 206, 208, and 210.

FIG. 2B illustrates the second process steps that are used to build the photosensitive devices. The two-dimensional switch matrices now become sensor arrays. In addition to the previously described layers, FIG. 2B illustrates a photosensor building layer 212. FIG. 2B also shows TFT sensor matrices 206, 208, and 210.

Figure 2C:
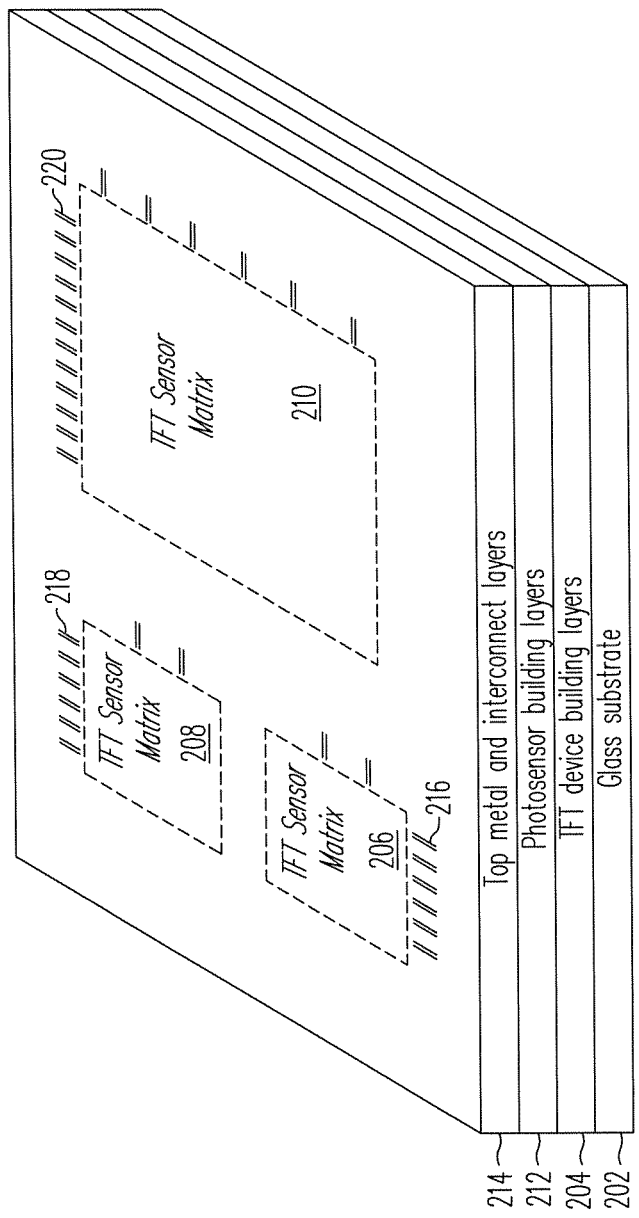

FIG. 2C illustrates the third process steps that are used to build the metal interconnect. Through the metal interconnect, lower metal layers merge onto the topmost metal layer for all input and output signals. In addition to the previously described layers, FIG. 2C illustrates a top metal and interconnect layer 214. FIG. 2C also illustrates inputs and outputs 216 associated with TFT sensor matrix 206, inputs and outputs 218 associated with TFT sensor matrix 208, and inputs and outputs 220 associated with TFT sensor matrix 210.

Figure 2D:
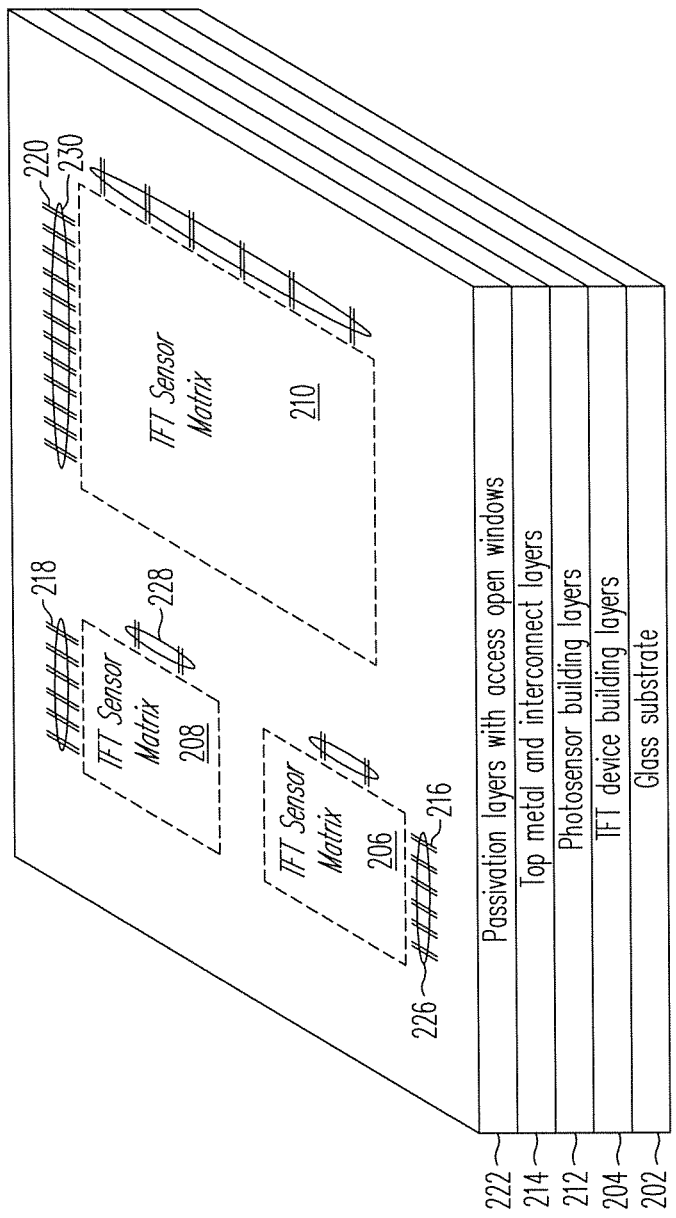

FIG. 2D illustrates the final process steps that are used to build a passivation layer. Access windows are opened for the input and output signals associated the image sensor device. In addition to the previously described layers, FIG. 2D illustrates a passivation layer 222 including access windows 226, 228, and 230.

FIG. 3A illustrates the first process steps at a first manufacturing facility according to a first method of the present invention. The first process steps are for building the TFT devices. These TFT devices (for example low-temperature polycrystalline silicon TFTs) can be used for pixel and/or peripheral circuits. For example, they may form pixel switches and/or sources follower transistors, and/or peripheral gate line drivers and/or data line multiplexers. FIG. 3A illustrates a top-gate CMOS TFT process flow with both p-type and n-type FETs. FIG. 3A illustrates a glass substrate layer 302, p-type Silicon region 304, n-type Silicon region 306, an unpatterned insulating layer 308, and a patterned first metal layer 310.

FIG. 3B illustrates the second process steps at the first manufacturing facility according to a first method of the present invention. The second process steps are used to build the second metal and protective layers. These electrical and mechanical protection layers are needed for inter-fab transition. CT1 represent the contact holes through the ILD and insulating layers. In addition to the previously described layers, FIG. 3B illustrates a patterned ILD layer 312 (the insulating layer 308 is now patterned as well), a second metal layer 314 including an electrical and mechanical protection layer, as well as a plurality of contact holes CT1 through the ILD and insulating layers. While the electrical and mechanical protection layer can be formed of conventional passivation materials such as photoresist, or photosensitive dielectric, other materials can be used such as Polydimethylsiloxane, spin-on dielectrics such benzocyclobutene, polyimides or other similar materials.

At this point in the manufacturing process, all of the manufacturing steps in the first manufacturing facility are completed and the partially formed image sensor device is ready for shipping to a second manufacturing facility. The second manufacturing facility can be a different section of the first manufacturing facility, or a manufacturing facility that is physically remote from the first manufacturing facility. Since the partially formed image sensor device is fragile due to the glass or other such substrate, prudent steps for securing the devices during shipping should be made including double crating using a slotted polystyrene or polypropylene inner box and a wood outer box and/or stacking the glass with polymer interleafs and crating the substrates with a layer of polystyrene followed by wood strapped together across two axes of the box.

Once the image sensor device is received at the second manufacturing facility, the upper portion of layer 314 is removed, which is the electrical and mechanical protection layer. This may be accomplished using a wet scrub and photoresist strip. Extra measures including oxygen plasma cleaning (ashing) and UV-Ozone can also be applied to ensure that the image sensor device is ready for the remaining process steps.

Figure 4A:
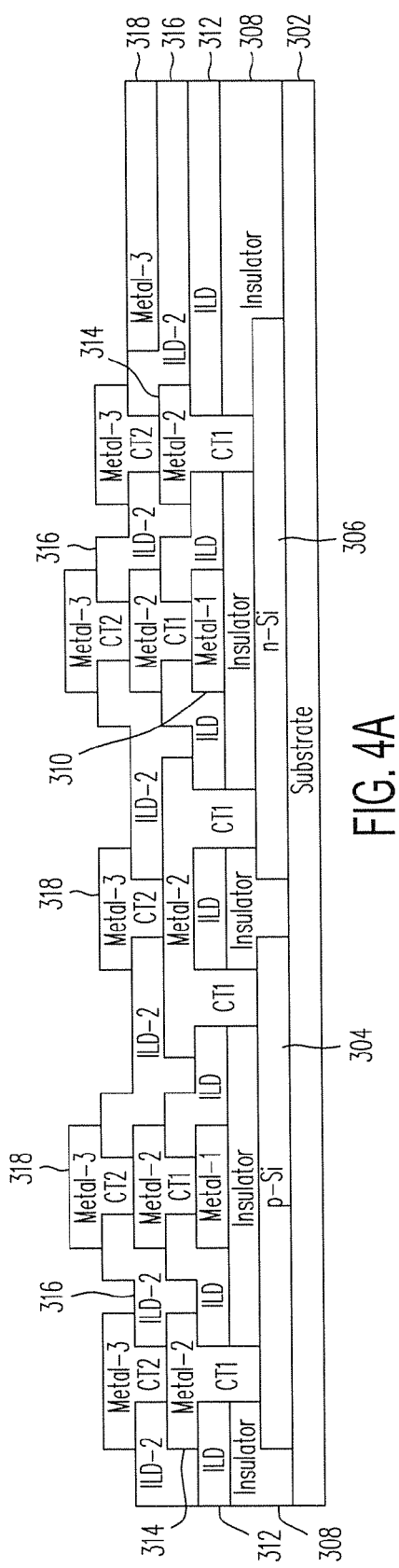
FIGS. 4A-4D illustrate, in cross-sectional views, a second set of manufacturing steps that takes place in a second manufacturing facility, according to the method of the present invention.

FIG. 4A illustrates the process steps at the second manufacturing facility necessary to remove the protective layers and to build the metal interconnect between the last metal layer completed at the first manufacturing facility (second metal layer 312) and to add the first metal layer of the second manufacturing facility (third metal layer 318). The second ILD layer 316 is the insulator between the second and third metal layers. It is important to note that the removal of the protective layers from the surface of the second metal layer 314 is necessary for inter-fab hybridization of multiple technologies. FIG. 4A thus illustrates a second ILD layer 316 and a third metal layer 318. A plurality of second contact holes CT2 is also shown.

Figure 4B:
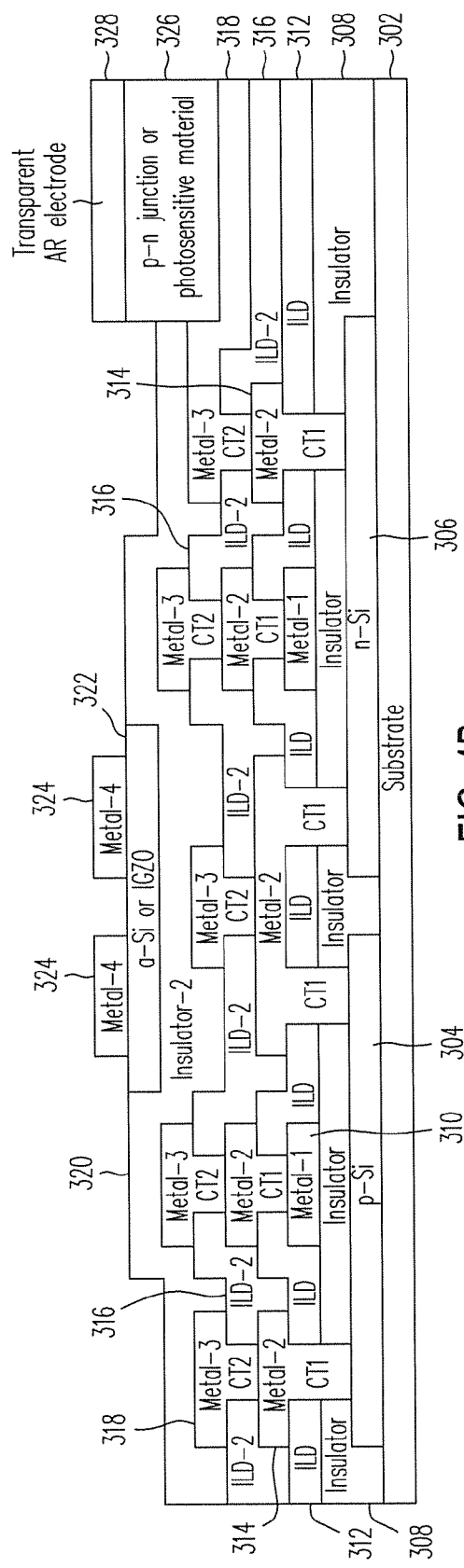

FIG. 4B illustrates the second process steps at the second manufacturing facility to build photosensors and/or different-type TFT devices for pixel and/or periphery circuits. To form the new type of TFT (for example, for a bottom gate TFT), in addition to the new semiconducting layer 322, a second insulating layer 320, and a fourth metal layer 324 are deposited and processed. The TFT technology at the second manufacturing facility can be amorphous Silicon (a-SI), IGZO (Indium Gallium Zinc Oxide) or others, assuming that the first manufacturing facility uses LTPS (Low-temperature polycrystalline silicon) technology. What is important to note is that semiconductor layers 304 and 306 can be different from semiconductor layer 322 due to the processing steps being carried out in separate facilities. The photosensors 326 can be amorphous Silicon or organic photodiodes. The transparent AR electrode 328 can be Indium Tin Oxide, Antimony Tin Oxide or solution processable materials including PEDOT:PSS (poly(3,4-ethylenedioxythiophene) polystyrene sulfonate), Ag Nanowires or Graphene. FIG. 4B thus illustrates a second insulating layer 320, a second semiconductor layer 322, a fourth metal layer 324, a photosensor layer 326, and an AR transparent electrode layer 328.

Figure 4C:
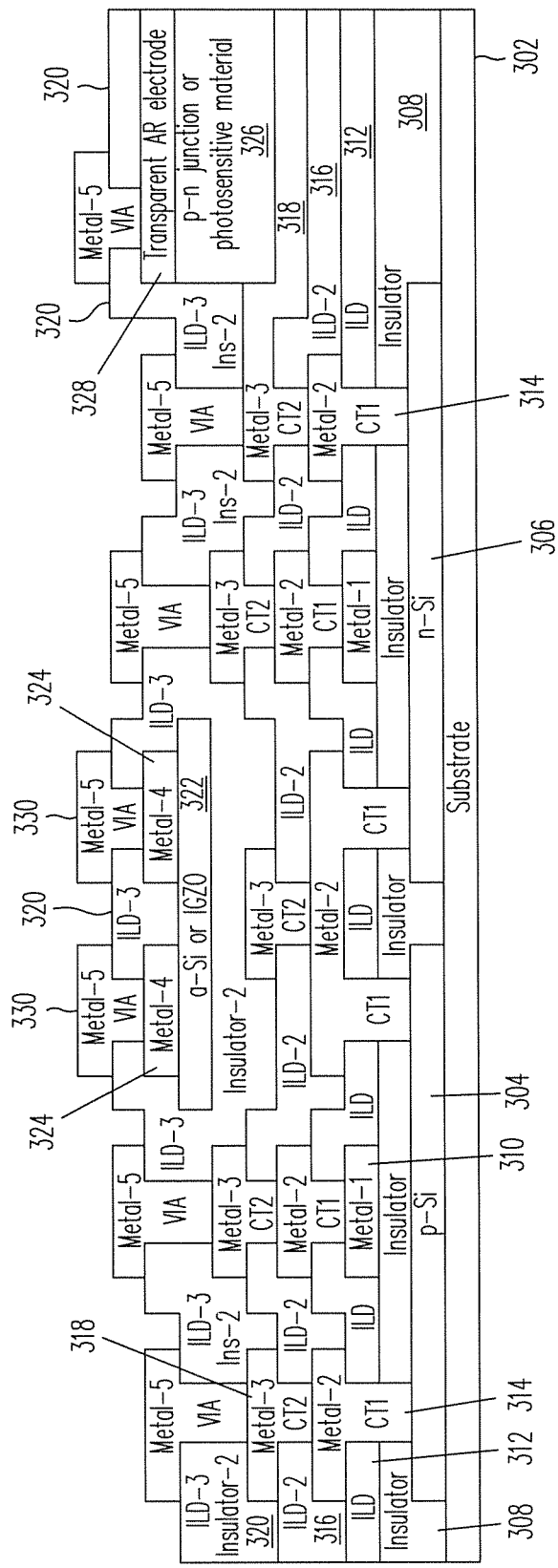

FIG. 4C illustrates the third processing steps performed at the second manufacturing facility in order to build the top metal layer and the associated interconnect metal. A plurality of VIAs through the third ILD layer and the second insulating layer are formed to enable the interconnect metal to provide electrical contact between the fifth metal layer and the third or fourth metal layers. In addition to previously illustrated layers, FIG. 4C thus shows a fifth metal layer 330, and a plurality of associated VIAs.

Figure 4D:
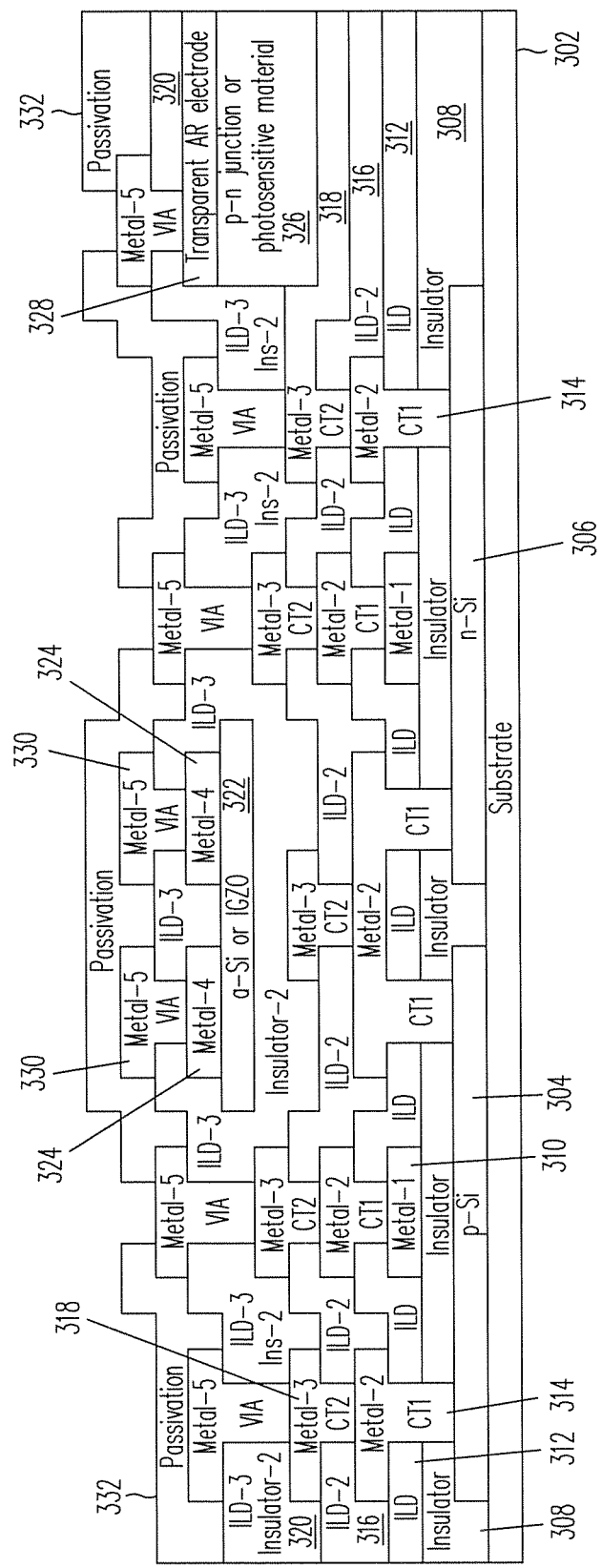

FIG. 4D illustrates the final process steps at a second manufacturing facility to build the passivation layer. The passivation layer provides the protection to the integrated circuit devices underneath against moisture and mechanical or chemical corrosion. Passivation windows are opened for bonding access. In addition to previously illustrated layers, FIG. 4D thus also shows passivation layer 332. Passivation layer can be formed of conventional passivation layer materials such as Silicon Oxynitride or Silicon Nitride, but BCB or Polysiloxane materials can also be used.

Figure 5A:
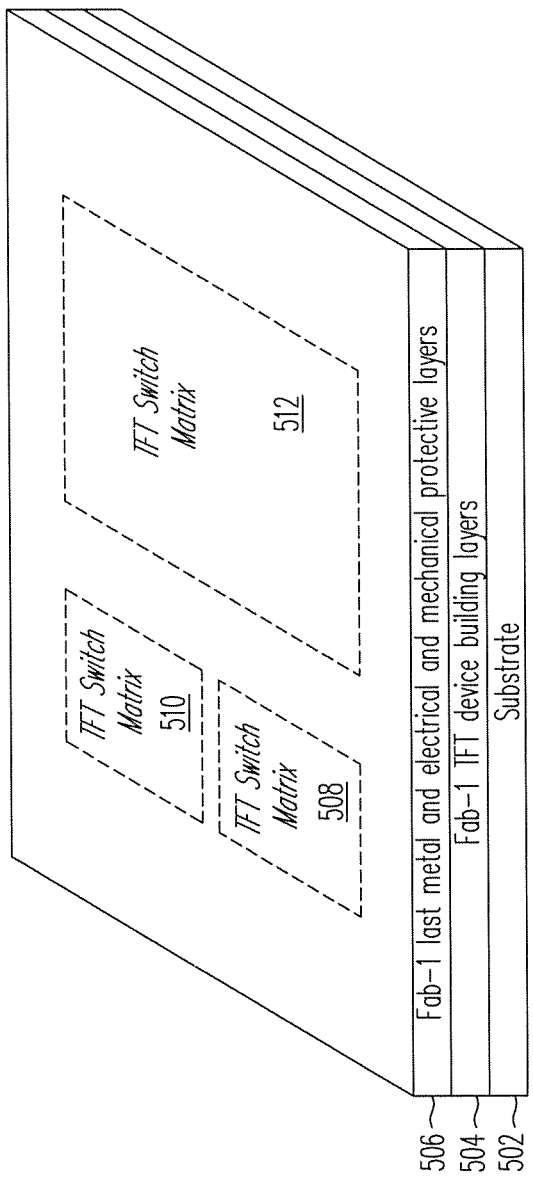
FIG. 5A illustrates plan view details associated with FIGS. 3A-3B.

FIG. 5A is associated with previously described figures FIGS. 3A-3B, but seen from an angle that reveals further plan-view details. Recall that the layers shown in FIG. 5A are formed in the first manufacturing facility. FIG. 5A thus shows a substrate layer 502, a TFT device layer 504, and a metal layer sealed with an electrical and mechanical protective layer 506. The surface of the partially formed image sensor device includes TFT switch matrices 508, 510, and 512. At this point in the manufacturing process the matrices are only switch matrices because the photosensors have not yet been built.

Figure 5B:
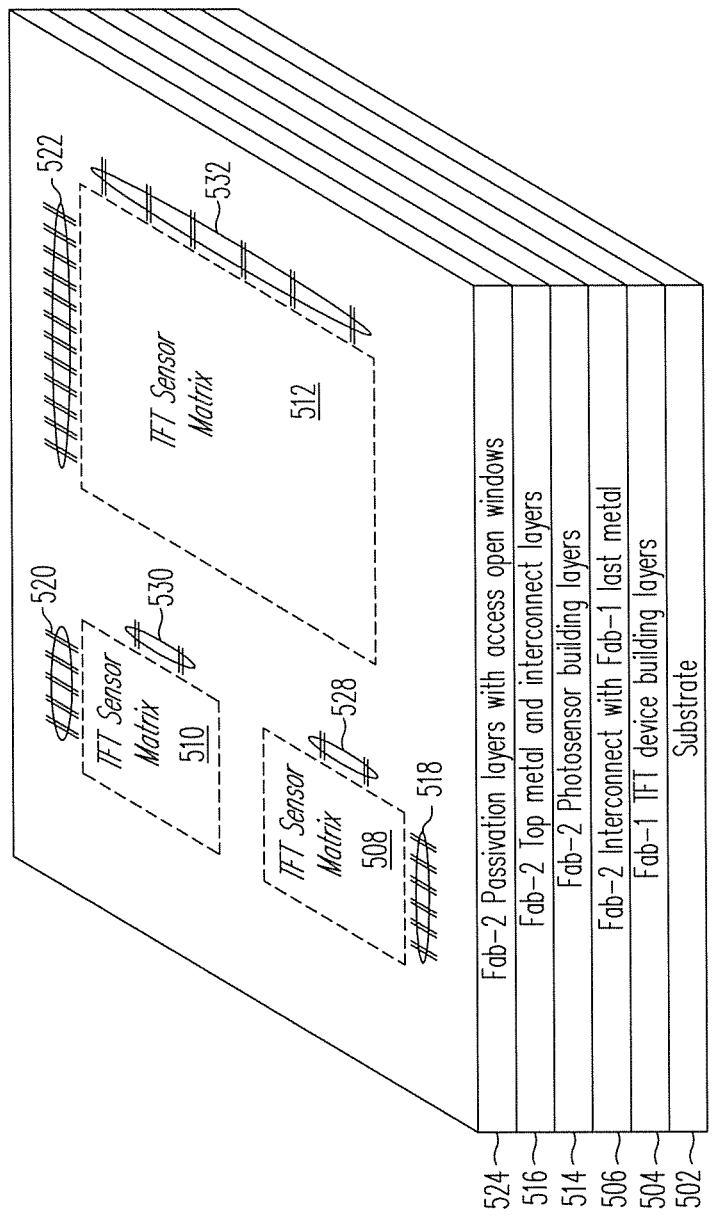
FIG. 5B illustrates plan view details associated with FIGS. 4A-4D.

FIG. 5B is associated with previously described FIGS. 4A-4D, but seen from an angle that reveals further plan-view details. Recall that the layers shown in FIG. 5B are formed in the second manufacturing facility. FIG. 5B thus shows the interconnect layer that operates on metal layer 506. In other words, metal layer 506 is both constructed in the first and second manufacturing facilities. Firstly to add the unpatterned layer, and then, secondly, to pattern the metal layer. FIG. 5B also shows a photosensor layer 514, a top metal and interconnect layer 516, and a passivation layer 524. The surface of the completed image sensor device shows inputs/outputs 518, 520, and 522, as well as corresponding passivation windows 528, 530, and 532.

Figure 6A:
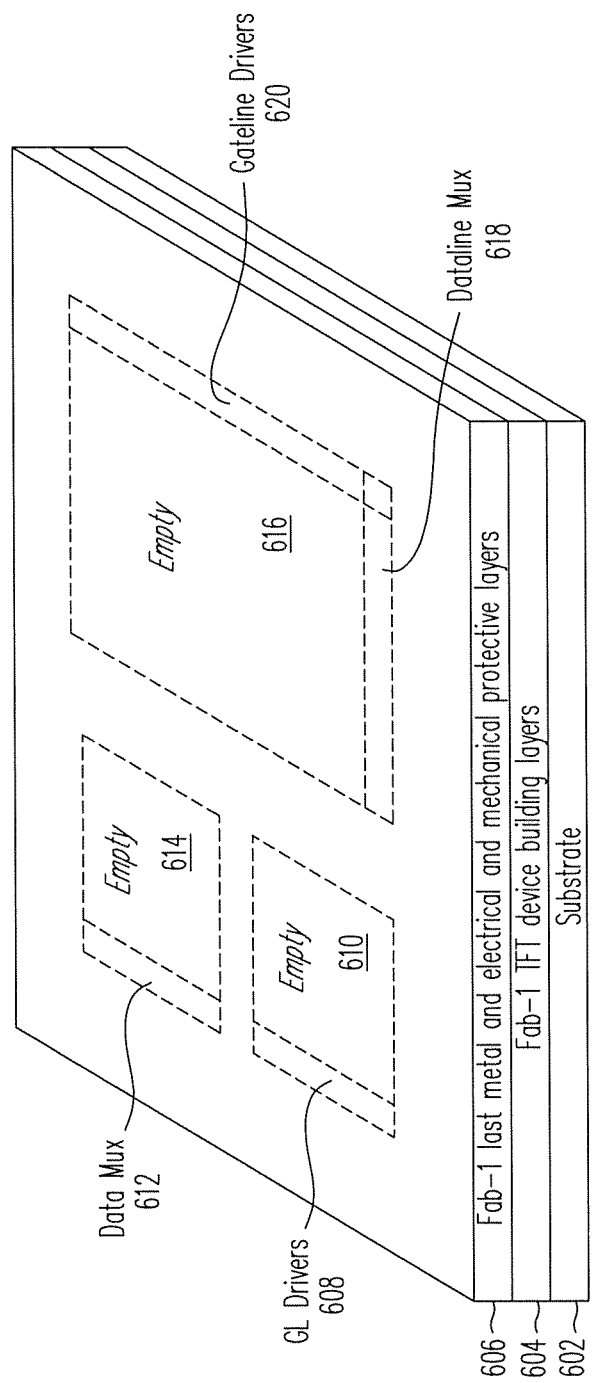
FIG. 6A illustrates a first set of manufacturing steps performed in a first manufacturing facility according to a second embodiment of the invention.
Figure 6B:
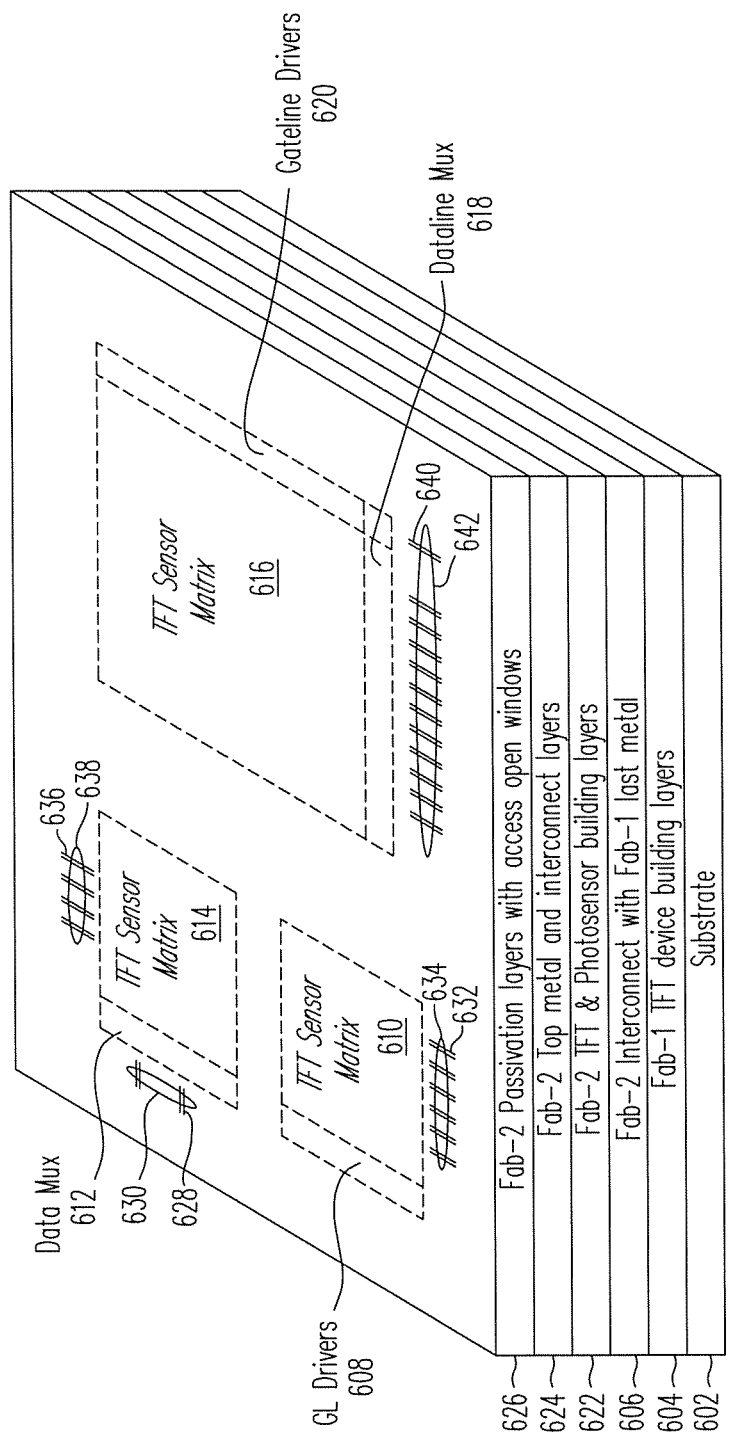
FIG. 6B illustrates a second set of manufacturing steps performed in a second manufacturing facility according to the second embodiment of the invention.

A second method of the present invention is illustrated with respect to FIGS. 6A and 6B. FIG. 6A illustrates the process steps associated with the first manufacturing facility, and FIG. 6B illustrates the process steps associated with the second manufacturing facility.

In FIG. 6A, the first manufacturing facility fabricates TFT devices for peripheral circuits only. The pixel-related TFTs and the photosensor devices are finished in the second manufacturing facility. FIG. 6A thus shows a substrate layer 602, TFT device layer 604, and metal and protective layer 606. The surface of the partially formed image sensor device includes gate line driver circuit 608, data multiplexer circuitry 612, data line multiplexer circuit 618, and gate line driver circuit 620. Note that subsequently formed circuits are now labeled "Empty" at locations 610, 614, and 616. In this particular manufacturing flow, the decision has been made that the TFT layer will only include the peripheral circuits, and will not be used to form the photosensor matrix.

In FIG. 6B, the second manufacturing facility strips off the protective layers and patterns the last metal layer as has been previous described. The second manufacturing facility fabricates the pixel TFT switches and photosensors, interconnect, top metal, and a final passivation layer with signal access open windows. FIG. 6B thus illustrates a TFT and photosensor layer 622, a top metal and interconnect layer 624, and a passivation layer with open access windows 626. The plan view of the completely formed image sensor device additional reveals that the previous empty sections are now TFT sensor matrices 610, 614, and 620. Inputs/outputs 628, 632, 636, and 640 are shown, with corresponding access windows 630, 634, 638, and 640.

Figure 7A:
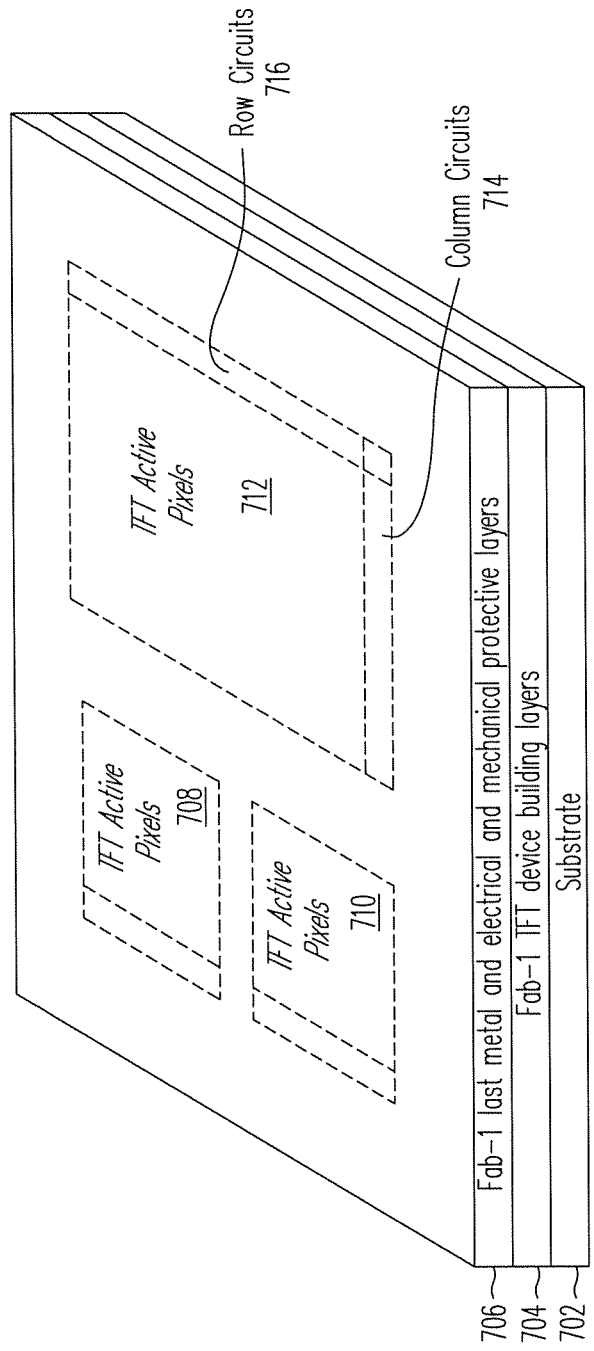
FIG. 7A illustrates a first set of manufacturing steps performed in a first manufacturing facility according to a third embodiment of the invention.
Figure 7B:
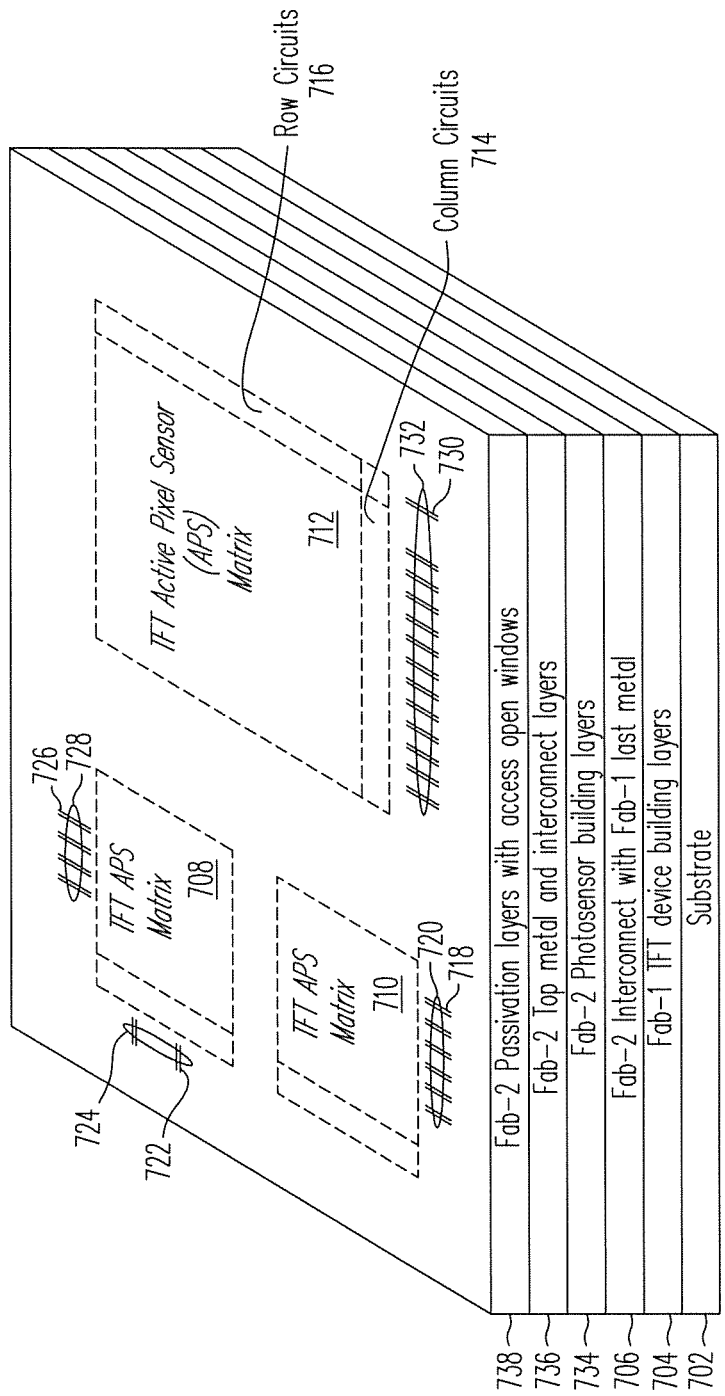
FIG. 7B illustrates a second set of manufacturing steps performed in a second manufacturing facility according to a third embodiment of the invention.

A third method of the present invention is illustrated with respect to FIGS. 7A and 7B. FIG. 7A illustrates the process steps associated with the first manufacturing facility, and FIG. 7B illustrates the process steps associated with the second manufacturing facility.

In FIG. 7A, the first manufacturing facility fabricates TFT devices for both active and peripheral circuits. The pixel-related TFTs are now made in the first manufacturing facility and the photosensor devices are finished in the second manufacturing facility. FIG. 7A thus shows a substrate layer 702, TFT device layer 704, and metal and protective layer 706. The surface of the partially formed image sensor device includes TFT active pixel circuitry (which does not include the actual photosensitive devices) 708, 710, and 712. Also shown are column circuits 714 and row circuits 716.

In FIG. 7B, the second manufacturing facility strips off the protective layers and patterns the last metal layer as has been previous described. The second manufacturing facility fabricates the photosensors, interconnect, top metal, and a final passivation layer with signal access open windows. FIG. 7B thus illustrates photosensor layer 734, a top metal and interconnect layer 736, and a passivation layer with open access windows 738. The plan view of the completely formed image sensor device additional reveals that the previous TFT active pixel circuits are now completely formed TFT active pixel sensor matrices 708, 710, and 712. Inputs/outputs 718, 722, and 730 are shown, with corresponding access windows 720, 724, and 732.

Figure 8A:
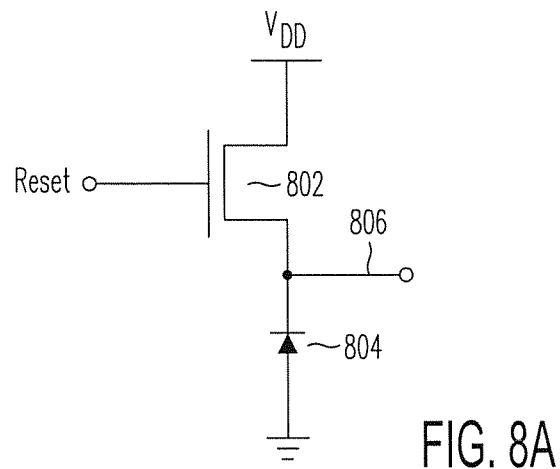
FIG. 8A illustrates a passive pixel circuit suitable for use with the manufacturing method of the present invention.
Figure 8B:
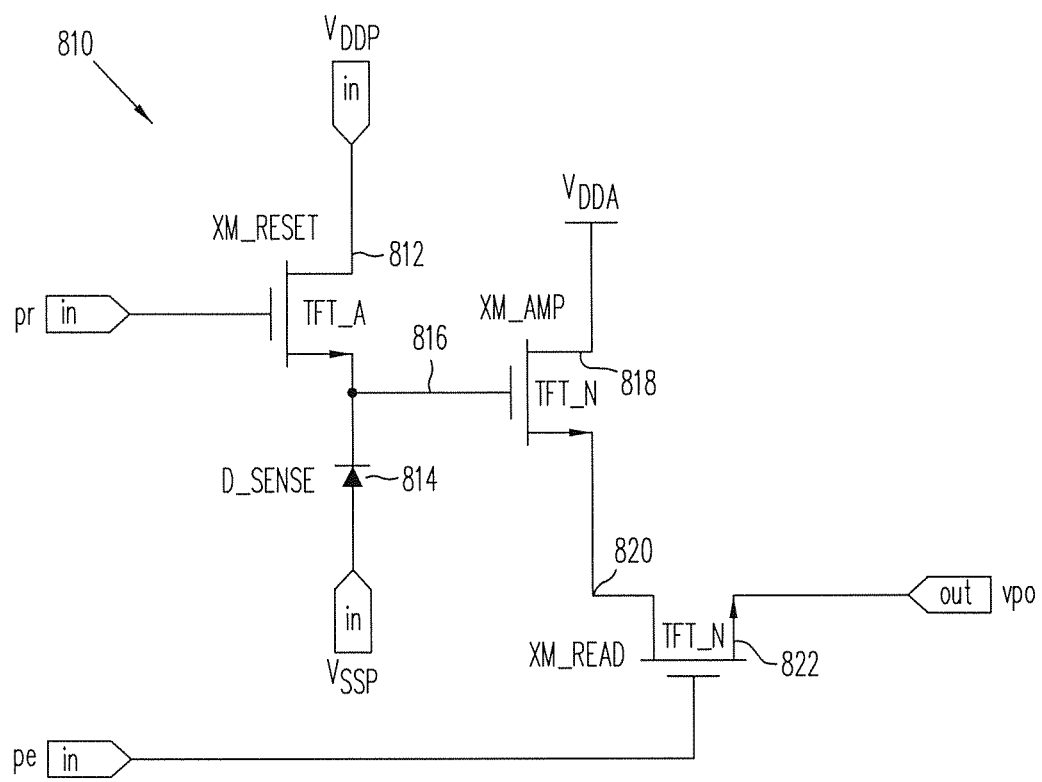
FIG. 8B illustrates an active pixel circuit suitable for use with the manufacturing method of the present invention.

The distinction between a passive pixel circuit and an active pixel circuit is shown in FIGS. 8A and 8B. FIG. 8A illustrates a passive pixel circuit including a switching transistor 802, a photodiode 804, and an output node 806. FIG. 8B illustrates an active pixel circuit including a switching transistor 812, a photodiode 814, an intermediate node 816, an emitter follower transistor 818, a read node 820, and a read transistor 822.

As an example, in FIG. 8B, a three transistor active pixel circuit is illustrated. The active pixel is composed of an amorphous transistor 812 for reset, two LTPS TFT devices for readout, 818 and 820, and a photodiode 814. The integration of the LTPS devices and the amorphous devices that are fabricated by two different processes combines the advantages of the TPS devices' signal processing and the amorphous devices signal sensing capability with ultra-low leakage current. Compared to the traditional passive pixel sensor simply comprised of a TFT switch and a diode as shown in FIG. 8A, active pixel circuits are of significant advantage to improve the signal-to-noise (SNR) of X-ray image signals. Hence, active pixel sensors demand a low-dose X-ray while maintaining the same or greater performance. In addition, the active pixel circuit shown in FIG. 8B is ideally suited to be fabricated according to the method described herein according to the present invention.

While numerous materials, thicknesses, and operating temperatures can be accommodated according to the present invention, a sampling of relevant and appropriate materials will be suggested below.

The substrate referred to above can be ideally a glass substrate formed from AluminoSilicates, Aluminoborosilicates, Alkaline earth boro-aluminosilicate, Floated Borosilicates or formed from a glass carrier with a polymer substrate such as polyimide, polyethylene napthalate, polyethersulforme, or cyclic olefin copolymer.

The TFT transistors referred to above can be formed of low temperature polysilicon, metal oxide including but not limited to IGZO, amorphous silicon, or organic TFT. The photosensitive elements can be an amorphous photoconductor such as selenium, a crystalline photoconductor such as PbI2, HgI2, or an organic photodiode such as Polythiophene and Phenyl-C61-butyric acid methyl ester bulk heterojunction.

The transparent electrode can be Indium Tin Oxide, Antimony Tin Oxide or solution processable materials including PEDOT:PSS, Ag Nanowires or Graphene.

The various metal layers above can include Aluminum, Titanium, Chrome, Molybdenum, Tungsten, Tantalum or multilayer combinations thereof.

The various insulating and ILD layers can include Silicon Oxynitride, Silicon Nitride, Silicon Oxide, BCB (Benzocyclobutene), Polyimide, Polysiloxane or multilayer combinations thereof.

Alignment of the partially completed image sensor from the first manufacturing facility to the first processing steps made in the second manufacturing facility is easily accomplished even if the first and second facility use photolithography equipment from different manufacturers. Specifically, two sets of alignment marks are created in the first manufacturing facility during the patterning of first metal layer. The first manufacturing facility aligns to their own first set of alignment marks whereas the second manufacturing facility aligns to the other second set of alignment marks. However, since both sets of alignment marks are made on the same layer and with the same photopatterning process they are intrinsically aligned to each other.

One of the advantages of using the method of the present invention is improved radiation hardening. The first manufacturing facility can create high performance peripheral circuits outside of any X-ray field that may be used and the second manufacturing facility can integrate an intrinsically radiation hardened TFT layer such as one made out of amorphous silicon. For example the first manufacturing facility could employ low temperature polysilicon TFTs in the periphery to integrate high speed integrated gate drivers and data multiplexing circuits and the second manufacturing facility could integrate amorphous silicon TFTs within the pixel active array. This would enable the use of the high performance CMOS based LTPS while still taking advantage of the intrinsic X-ray hardness of amorphous silicon in the active area. The method of the present invention further allows the manufacturing flexibility to craft additional shielding layers and other solutions for increased radiation hardening.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A method of manufacturing an image sensor device comprising:
   in a first manufacturing facility:
      forming a first set of patterned silicon, metal, and insulating layers on a glass substrate;
      forming an electrical and mechanical protection layer over the first set of patterned silicon, metal, and insulating layers;
   in a second manufacturing facility:
      removing the electrical and mechanical protection layer;
      forming a second set of patterned silicon, metal, and insulating layers over the first set of patterned silicon, metal, and insulating layers;
      forming a plurality of photosensors in communication with at least the second set of patterned silicon, metal, and insulating layers to form an unpassivated image sensor device; and
      forming a passivation layer over the unpassivated image sensor device,
   wherein the first set of patterned layers comprises p-type and n-type silicon regions.

2. The method of claim 1 wherein the first set of patterned layers comprises a first patterned metal layer and a second unpatterned metal layer.

3. The method of claim 2 wherein second set of patterned layers comprises second, third, and fourth patterned metal layers.

4. The method of claim 1 wherein the first set of patterned layers comprises a first insulating layer and a first inter-layer dielectric layer.

5. The method of claim 4 wherein second set of patterned layers comprises a second insulating layer and second and third inter-layer dielectric layers.

6. The method of claim 1 wherein the electrical and mechanical protection layer comprises a passivation layer.

7. The method of claim 1 wherein second set of patterned layers comprises an amorphous silicon or IGZO region.

8. The method of claim 1 wherein at least one of the plurality of photosensors comprises a p-n junction or photosensitive material.

9. The method of claim 1 wherein at least one of the plurality of photosensors comprises a transparent electrode.

10. A method of manufacturing an image sensor device comprising:
in a first manufacturing facility:
forming a first TFT device layer on a glass substrate;
forming a first metal layer over the TFT device layer;
forming an electrical and mechanical protection layer over the first metal layer;
in a second manufacturing facility:
removing the electrical and mechanical protection layer;
forming an interconnect metal layer coupled to the first metal layer;
forming a photosensor layer and a second TFT layer coupled to the interconnect metal layer;
forming a second metal layer coupled to the photosensor layer and the second TFT layer; and
forming a passivation layer over the second metal layer,
wherein the first TFT layer forms peripheral circuitry.

11. The method of claim 10 wherein the peripheral circuitry comprises at least one of a data line multiplexer circuit or a gate line driver circuit.

12. The method of claim 10 wherein the second TFT layer forms a TFT sensor matrix.

13. A method of manufacturing an image sensor device comprising:
in a first manufacturing facility:
forming a first set of patterned silicon, metal, and insulating layers on a glass substrate;
forming an electrical and mechanical protection layer over the first set of patterned silicon, metal, and insulating layers;
in a second manufacturing facility:
removing the electrical and mechanical protection layer;
forming a second set of patterned silicon, metal, and insulating layers over the first set of patterned silicon, metal, and insulating layers;
forming a plurality of photosensors in communication with at least the second set of patterned silicon, metal, and insulating layers to form an unpassivated image sensor device; and
forming a passivation layer over the unpassivated image sensor device,
wherein at least one of the plurality of photosensors comprises a p-n junction or photosensitive material.

14. The method of claim 13 wherein the first set of patterned layers comprises p-type and n-type silicon regions.

15. The method of claim 13 wherein the first set of patterned layers comprises a first patterned metal layer and a second unpatterned metal layer.

16. The method of claim 15 wherein second set of patterned layers comprises second, third, and fourth patterned metal layers.

17. The method of claim 13 wherein the first set of patterned layers comprises a first insulating layer and a first inter-layer dielectric layer.

18. The method of claim 17 wherein second set of patterned layers comprises a second insulating layer and second and third inter-layer dielectric layers.

19. The method of claim 13 wherein the electrical and mechanical protection layer comprises a passivation layer.

20. The method of claim 13 wherein second set of patterned layers comprises an amorphous silicon or IGZO region.

21. The method of claim 13 wherein at least one of the plurality of photosensors comprises a transparent electrode.

* * * * *